(12) United States Patent
Gogoi

(10) Patent No.: US 10,246,322 B2
(45) Date of Patent: Apr. 2, 2019

(54) DISTRIBUTED SENSOR SYSTEM

(71) Applicant: Versana Micro Inc., Scottsdale, AZ (US)

(72) Inventor: Bishnu Prasanna Gogoi, Scottsdale, AZ (US)

(73) Assignee: Versana Micro Inc., Scottsdale, AZ (US)

( * ) Notice: Subject to any disclaimer, the term of this patent is extended or adjusted under 35 U.S.C. 154(b) by 0 days.

(21) Appl. No.: 14/207,477

(22) Filed: Mar. 12, 2014

(65) Prior Publication Data

US 2014/0268524 A1    Sep. 18, 2014

Related U.S. Application Data

(60) Provisional application No. 61/793,860, filed on Mar. 15, 2013.

(51) Int. Cl.
  *B81B 7/02*    (2006.01)
  *H05K 7/02*    (2006.01)
  (Continued)

(52) U.S. Cl.
  CPC ............. *B81B 7/02* (2013.01); *H01L 27/14* (2013.01); *H01L 27/16* (2013.01); *H01L 27/22* (2013.01); *H01L 41/1132* (2013.01); *H01L 41/1138* (2013.01); *H05K 7/02* (2013.01); *B81B 2201/0207* (2013.01); *B81B 2201/0214* (2013.01); *B81B 2201/0228* (2013.01);
  (Continued)

(58) Field of Classification Search
  CPC .. H05K 3/3452; H05K 1/0393; H05K 1/0306; H05K 1/092; H05K 1/141; H05K 1/148; H05K 7/02; H05K 2201/0207; H05K 2201/0214; H01L 2924/01079; H01L 27/14; H01L 27/16; H01L 27/22; H01L 41/1132; H01L 41/1138; B81B 7/02; B81B 2201/0207; B81B 2201/0214; B81B 2201/0228; B81B 2201/0257; B81B 2201/0264; B81B 2201/0278; B81B 2207/012; B81B 2207/05; B81B 2207/09
  USPC ....... 361/749, 760, 783, 784, 789, 790, 792, 361/804
  See application file for complete search history.

(56) References Cited

U.S. PATENT DOCUMENTS 5,631,446 A * 5/1997 Quan ................... H01R 12/62
                                                              174/254
6,261,863 B1    7/2001 Beroz et al.
(Continued)

*Primary Examiner* — Michael P McFadden

(57) ABSTRACT

A distributed sensor system is disclosed that provides spatial and temporal data in an operating environment. The distributed sensor nodes can be coupled together to form a distributed sensor system. For example, a distributed sensor system comprises a collection of Sensor Nodes (SN) that are physically coupled and are able to collect data about the environment in a distributed manner. An example of a distributed sensor system comprises a first sensor node and a second sensor node. Each sensor node has a plurality of sensors or a MIMS device. Each sensor node can also include electronic circuitry or a power source. A joint region is coupled between a first flexible interconnect region and a second flexible interconnect region. The first sensor node is coupled to the first flexible interconnect region. Similarly, the second sensor node is coupled to the second flexible interconnect region.

20 Claims, 13 Drawing Sheets

(51) Int. Cl.
  *H01L 27/14* (2006.01)
  *H01L 27/16* (2006.01)
  *H01L 27/22* (2006.01)
  *H01L 41/113* (2006.01)

(52) U.S. Cl.
  CPC ......... *B81B 2201/0257* (2013.01); *B81B 2201/0264* (2013.01); *B81B 2201/0278* (2013.01); *B81B 2207/012* (2013.01); *B81B 2207/05* (2013.01); *B81B 2207/09* (2013.01); *H01L 2924/00* (2013.01)

(56) References Cited

U.S. PATENT DOCUMENTS

| | | | |
|---|---|---|---|
| 6,297,145 B1 | 10/2001 | Ito | |
| 6,353,188 B1 | 3/2002 | Fernandez | |
| 6,360,615 B1 | 3/2002 | Smela | |
| 6,613,979 B1 | 9/2003 | Miller et al. | |
| 6,743,982 B2 | 6/2004 | Biegelsen et al. | |
| 7,035,692 B1 | 4/2006 | Maghribi et al. | |
| 7,265,298 B2 | 9/2007 | Maghribi et al. | |
| 7,337,012 B2 | 2/2008 | Maghribi et al. | |
| 7,491,892 B2 | 2/2009 | Wagner et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,629,691 B2 | 12/2009 | Roush et al. | |
| 7,704,684 B2 | 4/2010 | Rogers et al. | |
| 7,799,699 B2 | 9/2010 | Nuzzo et al. | |
| 7,932,123 B2 | 4/2011 | Rogers et al. | |
| 7,982,296 B2 | 7/2011 | Nuzzo et al. | |
| 8,097,926 B2 | 1/2012 | de Graff et al. | |
| 8,217,381 B2 | 7/2012 | Rogers et al. | |
| 8,372,726 B2 | 2/2013 | de Graff et al. | |
| 8,389,862 B2 | 3/2013 | Arora et al. | |
| 8,536,667 B2 | 9/2013 | de Graff et al. | |
| 8,552,299 B2 | 10/2013 | Rogers et al. | |
| 8,629,353 B2 * | 1/2014 | Dinyari | B81B 7/04 174/254 |
| 2003/0020844 A1 | 1/2003 | Albert et al. | |
| 2003/0032946 A1 | 2/2003 | Fishman et al. | |
| 2003/0097165 A1 | 5/2003 | Krulevitch et al. | |
| 2003/0097166 A1 | 5/2003 | Krulevitch et al. | |
| 2007/0290683 A1 * | 12/2007 | Ikeda | B82Y 15/00 324/260 |
| 2010/0193234 A1 * | 8/2010 | Kisban | H01L 24/50 174/268 |
| 2010/0224950 A1 * | 9/2010 | Dinyari | B81B 7/04 257/441 |
| 2010/0234698 A1 * | 9/2010 | Manstrom | A61M 5/007 600/301 |
| 2011/0034912 A1 | 2/2011 | de Graff et al. | |
| 2011/0150036 A1 * | 6/2011 | Lee | G01K 7/02 374/179 |
| 2011/0218757 A1 | 9/2011 | Callsen et al. | |
| 2012/0129301 A1 * | 5/2012 | Or-Bach | G11C 8/16 438/129 |
| 2012/0133001 A1 * | 5/2012 | Tkaczyk | H01L 27/20 257/414 |
| 2012/0158101 A1 | 6/2012 | Stone et al. | |
| 2012/0244848 A1 | 9/2012 | Ghaffari et al. | |
| 2012/0256308 A1 | 10/2012 | Helin | |
| 2012/0261551 A1 | 10/2012 | Rogers | |
| 2012/0279762 A1 | 11/2012 | Hur et al. | |

\* cited by examiner

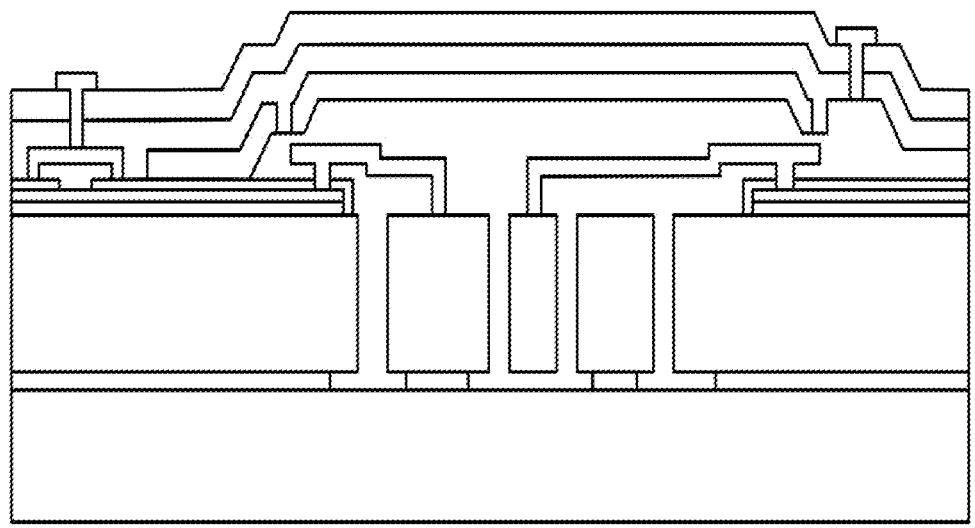
*FIG. 2*
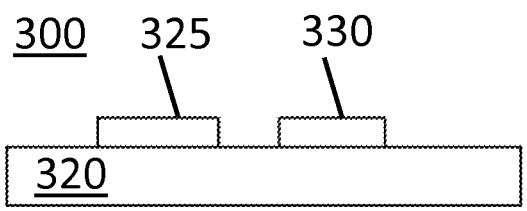
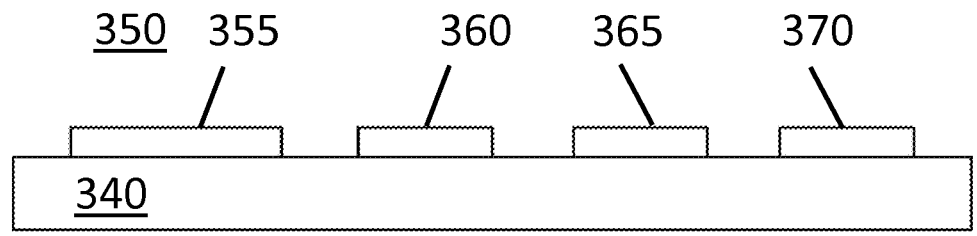
*FIG. 3*

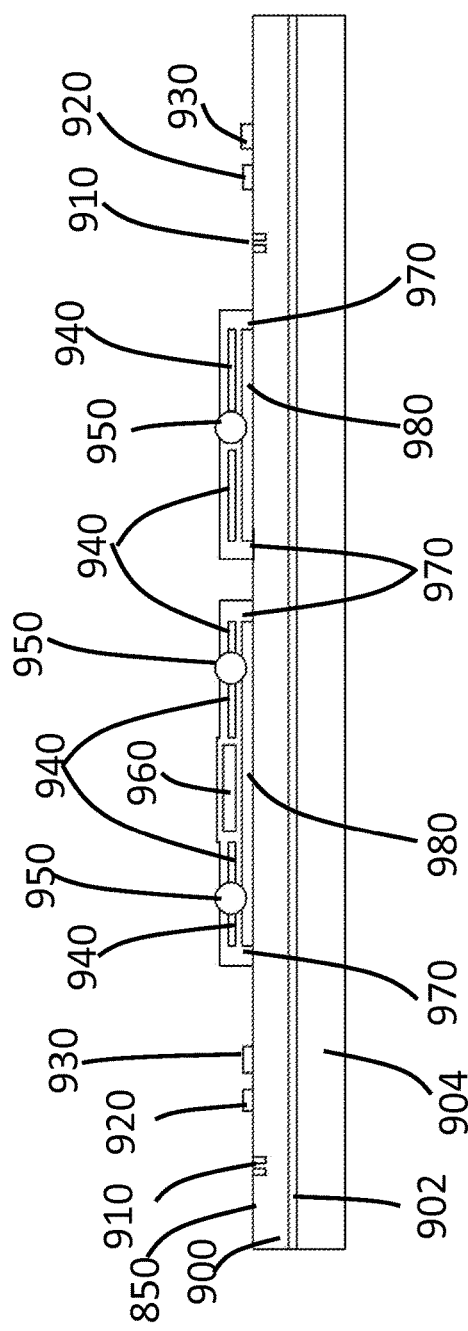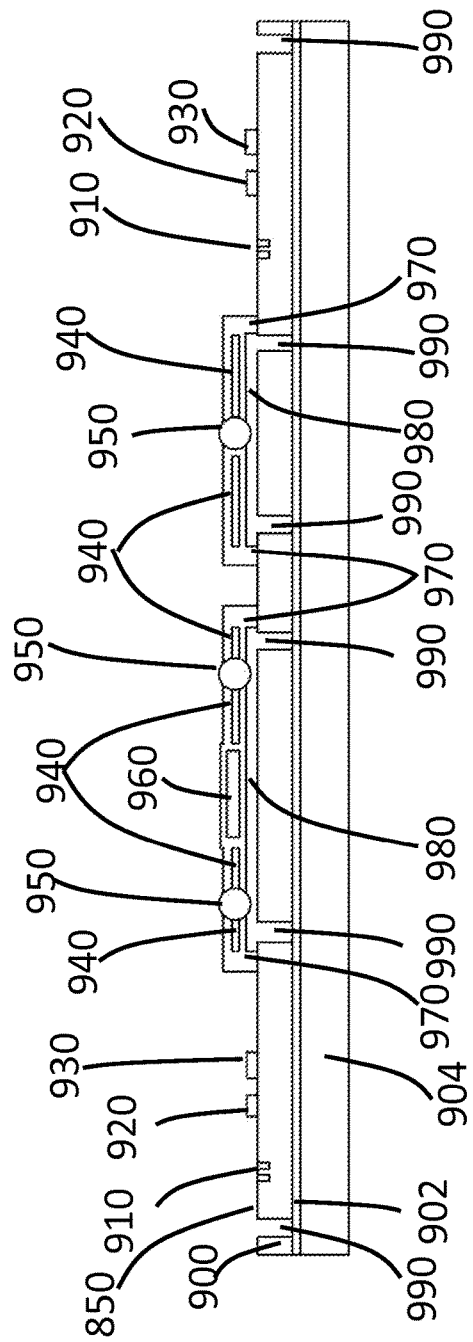

DISTRIBUTED SENSOR SYSTEM

CROSS-REFERENCE TO RELATED APPLICATIONS

This application claims the priority benefit of U.S. Provisional Patent Application No. 61/793,860 filed on 15 Mar. 2013 the disclosure of which is hereby incorporated herein by reference in it's entirety.

FIELD

The present invention generally relates to devices having more than one sensor and more particularly, to devices that are combined to form distributed sensors.

BACKGROUND

Many devices and systems include various numbers and types of sensors. The varied number and types of sensors are used to perform various monitoring and/or control functions. The systems can be active using real-time measurement data from the sensors in a work-flow or to control decision processes in operating devices. Sensors are used in conjunction with interface circuitry and control circuitry to connect with different sensor types, to control when measurements are taken, and to actively process the measurement data. Sensors are placed in proximity to the parameter being measured. Sensors can require direct interaction with the parameter of interest or conversely can be measured indirectly. In general, the number and uses of sensors is growing and being applied in a number of new and different applications.

Sensors can be mechanical, chemical, biological, electromechanical, or solid state to name but a few. A sensor is a singular component that is coupled to other electronic circuits via a printed circuit board or other connection means. MEMS (Micro-Electro-Mechanical Systems) technology is a type of micro-fabrication technique used to form a sensor that interacts with the environment to measure physical, chemical, or biological parameters. Thus, in recent years, many of the sensors used to perform monitoring and/or control functions use MEMS technology for their implementation. These sensors provide electrical parameters such as voltage, current, frequency, etc. as inputs to the interface circuits that are equivalent to the physical, chemical, biological etc. parameters that are being measured. At issue is that these sensors and other types of sensors are separate devices, a plurality of devices of the same type, or devices that measure similarly. Often to increase functionality or add further sensing capability different sensor types are combined in a package or on a PCB. This results in a larger foot-print, higher power consumption, higher complexity, increased cost and more complicated fabrication and assembly processes. Therefore, there is a need and benefit to combine sensors of different types, that measure different parameters, in a monolithic process, and on a semiconducting substrate that reduces the size, improves performance, lowers cost, and reduces manufacture and assembly. Furthermore, this will open the door to new and different applications that were limited by the scale of system integration. Therefore, there is a need to combine multiple sensors that measure different parameters and measure these parameters accurately in a spatial dimension using a system to provide information about the variation of multiple parameters over linear, planar or volumetric dimensions.

BRIEF DESCRIPTION OF THE DRAWINGS

Various features of the system are set forth with particularity in the appended claims. The embodiments herein, can be understood by reference to the following description, taken in conjunction with the accompanying drawings, in which:

FIG. 2 illustrates an example embodiment of an Indirect Interface Sensor (IIS);

FIG. 3 illustrates an example embodiment of a MIMS device (Monolithically Integrated Multi-Sensor);

FIG. 9 illustrates a simplified cross view of a fabrication step of a distributed sensor system with sensor node with MIMS device (Monolithically Integrated Multi-Sensor) in accordance with an example embodiment;

FIG. 10 illustrates a simplified cross view of a fabrication step of a distributed sensor system with sensor node with MIMS device (Monolithically Integrated Multi-Sensor) in accordance with an example embodiment;

Figure 1:
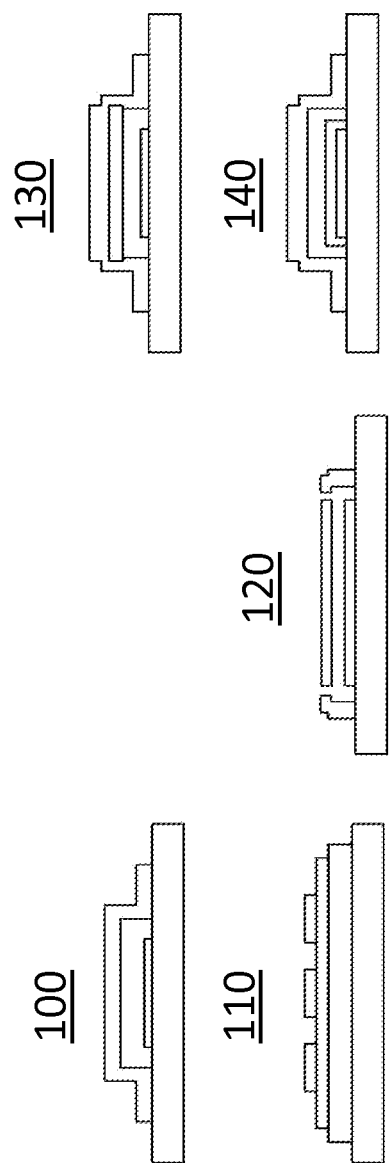
FIG. 1. illustrates example embodiments of Direct Interface Sensors (DIS)

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following description of exemplary embodiment(s) is merely illustrative in nature and is in no way intended to limit the invention, its application, or uses.

Processes, techniques, apparatus, and materials as known by one of ordinary skill in the art may not be discussed in detail but are intended to be part of the enabling description where appropriate. For example specific computer code may not be listed for achieving each of the steps discussed, however one of ordinary skill would be able, without undo experimentation, to write such code given the enabling disclosure herein. Such code is intended to fall within the scope of at least one exemplary embodiment.

In all of the examples illustrated and discussed herein, any specific materials, such as temperatures, times, energies, and material properties for process steps or specific structure implementations should be interpreted to be illustrative only and non-limiting. Processes, techniques, apparatus, and materials as known by one of ordinary skill in the art may not be discussed in detail but are intended to be part of an enabling description where appropriate. It should also be noted that the word "coupled" used herein implies that elements may be directly coupled together or may be coupled through one or more intervening elements.

Additionally, the sizes of structures used in exemplary embodiments are not limited by any discussion herein (e.g., the sizes of structures can be macro (centimeter, meter, and larger sizes), micro (micrometer), and nanometer size and smaller).

Notice that similar reference numerals and letters refer to similar items in the following figures, and thus once an item is defined in one figure, it may not be discussed or further defined in the following figures.

Modern electronic systems use different sensors that interact with the environment and transduce this information into the electrical domain. The input domain thus can be physical, chemical, biological etc. Thus, the sensors that interact with these domains can be classified as physical, chemical and biological sensors. These sensors may use a variety of transduction principles (based on physical, chemical and biological phenomena) to produce the equivalent electrical parameters that are the inputs to the interface circuit. These sensors have been realized by a variety of manufacturing processes but essentially realizing the same transduction principles.

In order to derive benefits of high performance, low cost, low power consumption, small size and form factor, these sensors are realized in a singular form by integrated circuit processes. Examples of different sensors Physical sensors are:

Inertial sensor—linear acceleration—multi-axis
Inertial sensor—angular acceleration—multi-axis
Inertial sensor—vibration—multi-axis
Inertial sensor—shock—multi-axis
Inertial sensor—angular rate—multi-axis
Pressure sensor—absolute
Pressure sensor—differential
Pressure sensor—gage
Tactile sensor—touch
Humidity sensor—relative humidity
Temperature sensor—ambient
Temperature sensor—infra-red
Temperature sensor—contact
Microphone—audio
Force sensor—force
Load sensor—loads and strain—multi-axis
Magnetic sensor—multi-directional magnetic fields
Flow sensor—fluid flow
Light sensor—imaging
Electrical field sensor
Electrical impedance—probe
Galvanic Skin Response sensor
Chemical sensors:
Various chemicals including gases, liquids and solids
Biological sensors:
Various biological samples of cells, tissue, fluids
Biological probes for neural, muscular signals The sensors can be classified also by how they interact with the measuring environment. In a broad classification, sensors can be classified as Direct Interface Sensors (DIS)
Indirect Interface Sensors (IIS)

Direct Interface Sensors:

Some sensors need to interact directly with the sensing environment and must be exposed to the sensing medium. These sensors are called Direct Interface Sensors (DIS). The DIS must interact directly with the measurand and be able to withstand all the effects due to the exposure to the media where the sensor is used. Some examples of this class of sensors are pressure sensors where the ambient pressure must act on the measuring membrane and then transduced to an equivalent electrical signal. Similarly, a humidity sensor is exposed to the ambient humidity and provides an equivalent electrical signal. Also, a microphone responds to the sound waves and is directly exposed to it. The microphones that are fabricated have to be in contact with the biological component that it is measuring. A neural probe has to be in contact with nerve cells while a muscle stimulating electrode must contact with muscle cells. Similarly, a flow sensor is exposed to the flow of the fluid directly to measure the flow. FIG. 1 illustrates example embodiment of Direct Interface Sensors (DIS).

Direct Interface Sensors can be further classified as
Direct Interface Sensors—No Line of Sight
Direct Interface Sensors—Line of Sight
Direct Interface Sensors—Through a Medium
Direct Interface Sensors—No Line of Sight These Direct Interface Sensors need to be directly exposed to the sensing environment and not in the direct line of sight of the parameter that is being measured. In this case, the sensor responds to the sensed parameter of interest and do not need to be in the direct line of sight. An example of this type of DIS is a pressure sensor that senses the ambient pressure and produces a transduced signal. Another example would be a humidity sensor that senses the ambient humidity and produces the equivalent transduced signal.

In FIG. 1 100 is a pressure sensor which is a direct interface sensor and 110 is a humidity sensor which is also a direct interface sensor.

Direct Interface Sensors—Line of Sight

These Direct Interface Sensors need to be directly exposed to the sensing environment and directly in the line of sight of the parameter that is being measured. An example would be an optical sensor that is receiving input from the light source in front of it. Another example would be a microphone which is receiving audio energy from an audio source in front of it. Another example of a direct interface sensor would be a Galvanic skin Response sensor.

In FIG. 1, 120 is a microphone as an example of direct interface sensor with line of sight.

Direct Interface Sensors—Through a Medium

These Direct Interface Sensors need to be exposed to the sensing environment but not directly but through a medium. These sensors sense the parameter of interest through a medium. An example of this type of DIS would be a magnetic field sensor which can be enclosed in a cavity and still be exposed to the parameter of interest and produce an equivalent transduced signal. Another example of this sensor can be an optical sensor in a cavity with an optically transparent window and which produces an equivalent transduced signal.

In FIG. 1, 130 is a magnetic sensor which is enclosed in a cavity to sense the magnetic field and 140 is an optical sensor which is enclosed in a cavity with a transparent window.

Indirect Interface Sensors

The second class of sensors does not need to be in direct contact or have direct exposure to the measuring environment. In this class of sensors, the sensing element or elements are indirectly exposed to the measurand and then provides a transduced electrical signal. This class of sensors is classified as Indirect Interface Sensors (IIS). An example for an IIS is an inertial sensor such as an accelerometer where the sensor element is in an enclosed environment and responds to the change in the acceleration and provides an equivalent electrical signal. In this class of sensors, the sensor element is not directly exposed to the measuring environment. Similarly, a gyroscope responds to the rate of rotational change without being exposed to the measuring environment. FIG. 2 illustrates an accelerometer 200 as an example embodiment of an Indirect Interface Sensor (IIS).

The design and fabrication of sensors for measuring different environmental parameters have some common characteristics that can be utilized in the combination of sensors.

These structural elements may contain elements that respond to different physical, chemical, biological inputs. These structural elements may perform mechanical, electrical, chemical, material functions that enable the functioning of the sensors. The structural elements can be static or capable of movement, where it responds to an input or is subjected to movement by application of an applied force. These structural elements can form different parts of a sensor such as Suspensions
Plates
Beams
Membranes
Diaphragms
Wires
Anchors
Pillars
Posts
Walls
Tubes
Tips
Cavities
Sealed cavity in vacuum
Sealed cavity under pressure These structural elements can perform different functions that enable the implementation of different sensors Moving electrodes
Reference electrodes
Test electrodes
Shielding electrodes
Platforms for sensing materials
Provide electrical isolation
Provide thermal isolation
Provide mechanical isolation These structural elements can be implemented in different sensors to provide different functions for different sensors. By combining different structural elements to provide different functions for different sensors, multiple sensors can be implemented using a parallel design method and common fabrication process. The sensors can be combined using a structured method which is described below Determine the sensors required for the platform
Define the performance specifications for each sensor
Choose a common transduction principle for the majority of the sensors—capacitive, piezoresistive, piezoelectric, optical, resonant
Determine the transduction principle for the rest of the sensors
Identify the sensor with the highest fabrication complexity
Determine the fabrication flow for the sensor with the highest complexity
Determine the structural components for each of the other sensors
Determine the unique requirements for each sensor
Design each sensor for the specified performance
Iterate as needed until all performance specifications are met By combining different structural components from different sensors, it is possible to integrate multiple sensors on a common substrate that share structural layers for their implementation. This may be defined as a MIMS (Monolithically Integrated Multi-Sensor) device. A MIMS device may be defined as a collection of multiple sensors that are formed using substantially common layers on a common substrate. These multiple sensors perform different functions and respond to different input stimulus. The term "Monolithically Integrated" implies implementation on the same substrate, which may be a wafer. The substrate may be formed of semiconducting wafers or on conductive or non-conductive layers. The term "Multi-Sensor" means a number of at least two sensors formed on the substrate. The sensors formed on the MIMS device may comprise of direct interface sensors and indirect interface sensors. The multiple sensors of a MIMS device may be formed on a single substrate and then combined with an integrated circuit or it can be comprised of multiple sensors formed on the same substrate as an integrated circuit. Thus, a MIMS device may comprise of multiple sensors on the same substrate which may be semiconducting and also used to form an integrated circuit. The layers used for the implementation of a MIMS device may consist of a substrate on which different materials may be deposited, grown or formed. The substrate may itself be considered as a layer used for the formation of the MIMS device. The substrate may be formed of semiconducting material and may comprise of single crystal silicon, germanium, gallium arsenide, gallium nitride, indium phosphide and the like. The substrate may also comprise of layers of materials that can be semiconducting, insulating and the like. An example of a layered substrate may be a SOI (silicon on insulator) where a semiconductor wafer is bonded to another semiconductor layer with an intermediate bonding layer of insulating oxide. Another example of a layered substrate may be a SOS (silicon on sapphire) where a silicon semiconducting layer is boned to the surface of a sapphire insulating wafer.

The layers used for the MIMS device can also be deposited on the surface of the substrate and can be deposited using semiconductor processes such as LPCVD, PECVD, APCVD, SACVD, PVD, ALD, MOCVD, MBE and the like. The layers of a MIMS device can also be sputtered, evaporated, spin-coated, spray coated, electro-plated and the like.

The layers used for a MIMS device can also be grown using such processes as thermal growth, such as silicon dioxide, epitaxially growth using such processes as low temperature epitaxial growth, non-selective epitaxial growth and the like.

The layers used for a MIMS device are formed on the entire surface of the substrate for forming multiple sensors and then patterned to form elements or components of different sensors. The layers used for a MIMS device may be patterned using resist and photolithography and then etched using a wet etch, dry etch, a combination of wet and dry etch. The layers used for a MIMS device may also be patterned using physical methods such as laser etching, ion-milling and the like.

The patterning of the layers used in a MIMS device forms different structural components for different sensors that can be static or dynamic. The combination of these layers and the components formed using patterning allows for multiple sensors to be formed on a common substrate for a MIMS device. The multiple sensors formed on a MIMS device may consist of Direct Interface Sensors, Indirect Interface Sensors and a combination of the two.

The MIMS device may consist of an integrated circuit formed on the same semiconducting substrate or it may be combined with the integrated circuit using wirebonding or stacking or a combination of the two. For a MIMS device stacked with an integrated circuit, the MIMS device and the integrated circuit are placed so that electrical contacts from the MIMS device are vertically connected to the corresponding electrical contacts of the integrated circuit. The vertical contacts between the stacked MIMS device and integrated circuit may use vertical interconnects such as TSV (Through Silicon Vias), flip-chip, and the like. The vertical interconnects may use a bond or solder to reduce contact resistance between the electrical contacts of the MIMS device and the interface circuit.

FIG. 3 illustrates an example embodiment of a MIMS device 300 formed on the same substrate 320 and containing a Direct Interface Sensor 325 and an Indirect Interface Sensor 330. Another example of a MIMS device 350 is shown in FIG. 3 where the same common substrate 340 is used to form Indirect Interface Sensor 355, a Direct Interface Sensor 360, a Direct Interface Sensor with line of sight 365 and a Direct Interface Sensor inside a cavity 370.

In order to increase the functionality of the multiple sensors that are formed using stacked, co-designed or hybrid technologies, they must be integrated with further control and communication capabilities along with a power source. Such a combination of sensors, control, communications and power devices is called a sensor node. This sensor node is used to operate in an environment and collect data, analyze, store, communicate and initiate responses to changes in different parameters in the ambient environment. Each sensor node to be deployed in the field has the following capability Sensing—a collection of Direct Interface Sensors and Indirect Interface Sensors using MIMS technology to gather data from the ambient environment Interface circuit—conversion of the Direct Interface Sensors and Indirect Interface Sensors to equivalent electrical signals, signal conditioning, error correction and then further conversion from analog to digital form Controller—a microcontroller to determine how each node is being utilized—how each node is identified, when it is collecting data, when it is asleep, when it should transmit data, what is the duty cycle etc.

Figure 4:
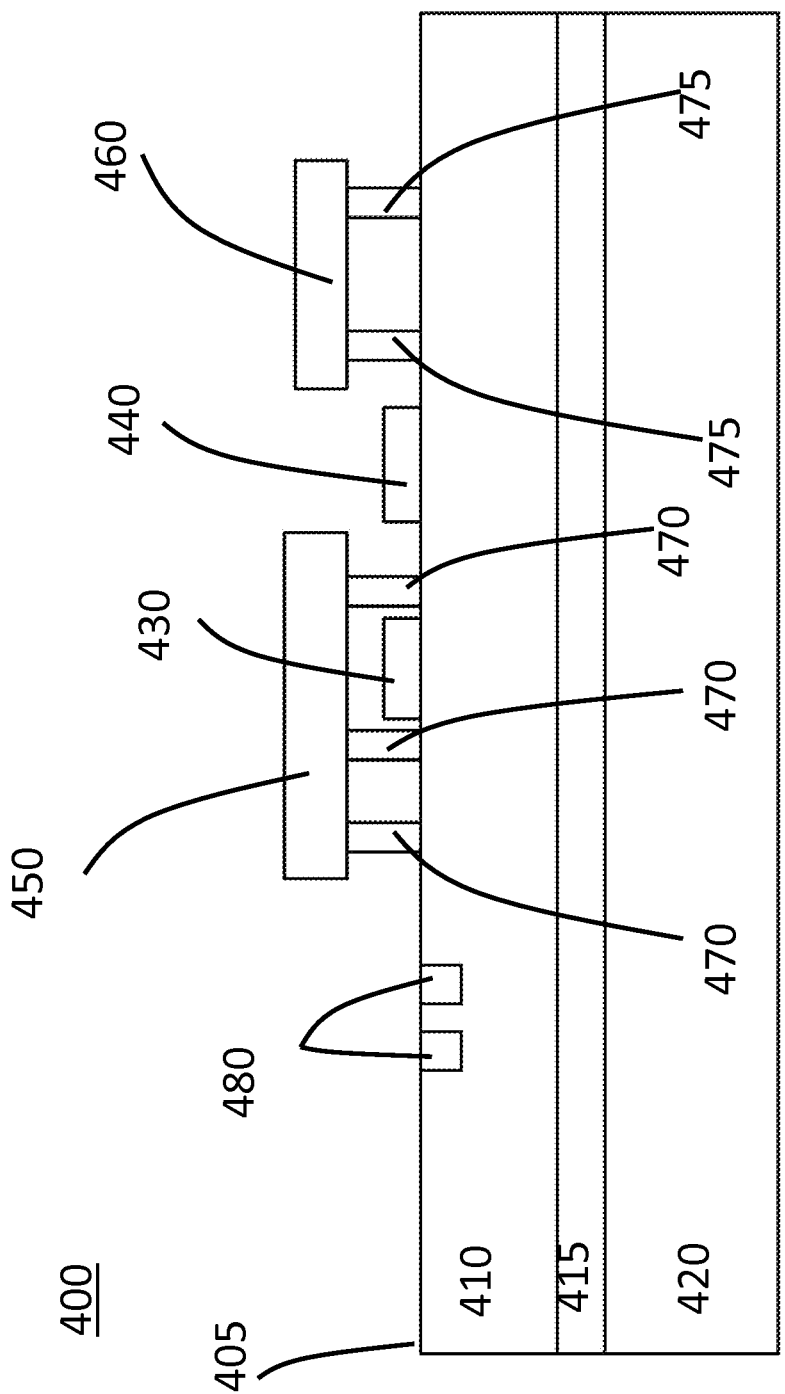
FIG. 4 illustrates an example embodiment of a sensor node with a MIMS device (Monolithically Integrated Multi-Sensor)

Communication—a communication chip that is controlled by the controller—it provides communication capability to the sensor node. It can transmit and receive data, provide necessary encryption, transmission algorithms, instructions, network information, node identification etc. The communication chip is connected to an antenna Power source—a source of power for the sensor node. This can be a thin film battery, a rechargeable battery, fuel cell, button cell, inductive antenna for reception of transmitted power. There may also be storage elements such as super-capacitors etc. to store energy. It may also contain elements that harvest or scavenge from the ambient environment and use it to support the primary energy source. The power source is controlled by the controller to provide optimum utilization of the energy for the sensor node. FIG. 4 illustrates an example embodiment of a sensor node and its components.

The substrate 405 is the initial structure on which the sensors are formed. The substrate 405 may also be used for forming other devices such as semiconductor devices, integrated circuits, actuators. The substrate 405 may be in the form of wafers that are typically round in shape. It may also be of other shapes such as squares, rectangles that may be compatible with semiconductor fabrication process. If substrate 405 is in the form of wafers, it may be formed with single crystal silicon. Substrate 405 may also be formed with multiple layers that contain both conducting and insulating layers. In one embodiment, it may be composed of silicon on insulator (SOI). In other embodiments, it can be SOx, (silicon on x—where x is a carrier wafer that may be composed of germanium, sapphire, silicon carbide). For the embodiment in FIG. 4 where the substrate is SOI, the sensor node 400 is formed on a substrate 405 that consists of a carrier wafer formed on single crystal silicon known as the handle wafer 420. Above the handle wafer is an intermediate layer of silicon dioxide known as the Buried Oxide (BOX) 415. Above the BOX, there is another layer of single crystal silicon layer called the device layer 410. In FIG. 4, 430 represents Indirect Interface Sensors while 440 represents Direct Interface Sensors. These Direct Interface Sensors 440 and Indirect Interface Sensors 430 represent a MIMS device (Monolithically Integrated Multi-Sensors) formed on the substrate 405. The sensor node contains an integrated circuit 450 that includes the interface circuit, controller, communication circuit and the like. The integrated circuit is connected to the MIMS device comprising 430 and 440 and other elements of the sensor node 400 using contacts 470. The contacts may be flip-chip bumps, through silicon vias (TSV) and the like that connects the integrated circuit 450 with the other components of the sensor node 400. The sensor node 400 also contains a power source 460 that provides electrical power to the sensor node. Thus, the power source 460 may comprise a thin film battery, a rechargeable battery, fuel cell, button cell and the like. The power source is connected to the other elements of the sensor node using contacts 475. The contacts may be flip-chip bumps, through silicon vias (TSV) and the like that connects the power source 460 with the other components of the sensor node 400. The sensor node 400 also contains an antenna 480 that is used for communication and power transfer between the sensor node 400 and other transmitters and receivers that use wireless technology.

To enhance the capability of the sensor node, it is necessary to combine different sensor nodes so that they can provide information about the spatial and temporal distribution of different physical, chemical, biological and environmental parameters. In order to be efficiently deployed, these collection of sensor nodes must be physically connected and have intelligence for their operation, a power source for deployment, communication capability for forming networks and be capable of scaling as required by the operating environment. The system must have flexibility in its form factor so that it can adjust to different application environments.

Figure 5:
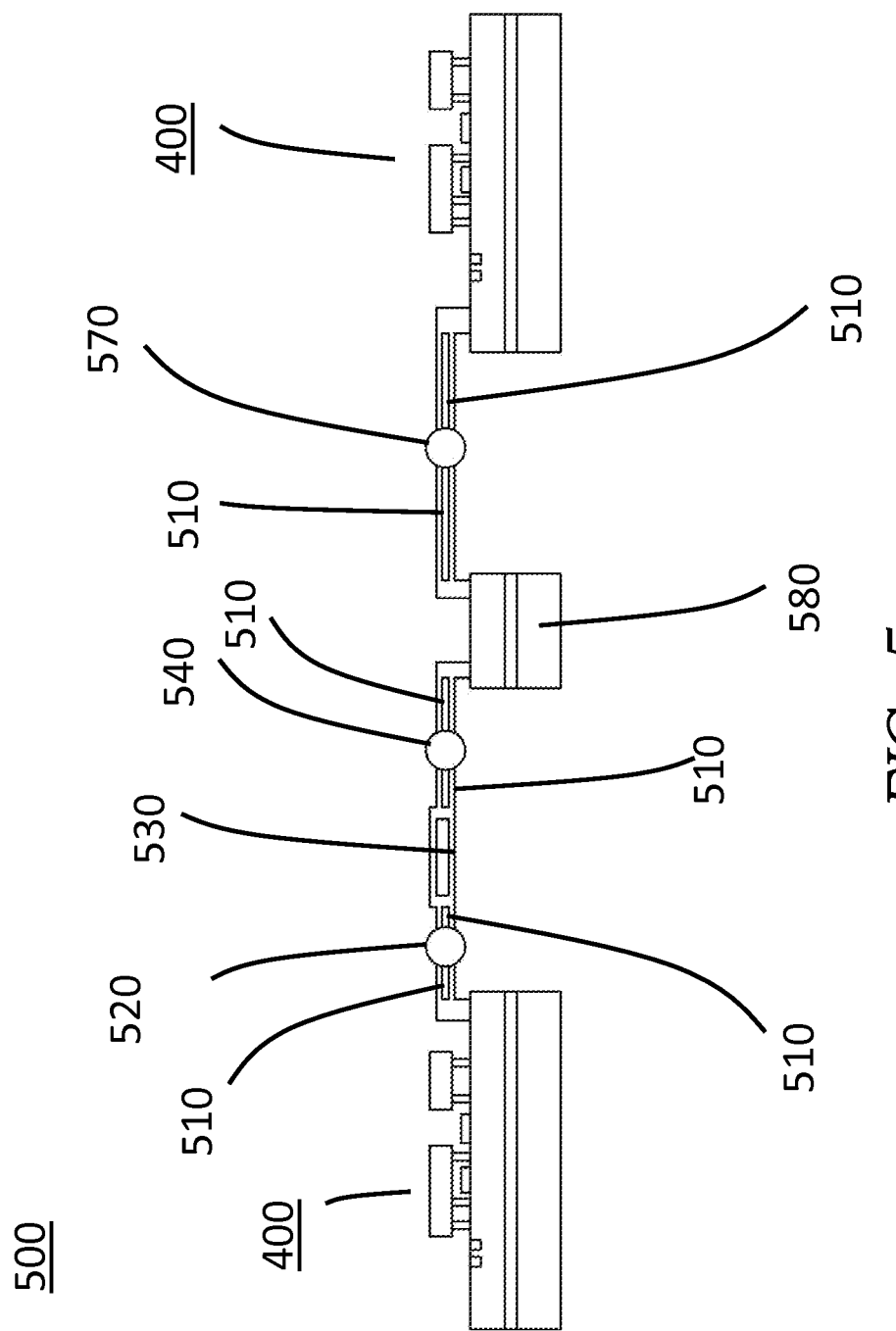
FIG. 5 illustrates a simplified cross section view of a distributed sensor system with sensor node with MIMS device (Monolithically Integrated Multi-Sensor) in accordance with an example embodiment.

To provide the spatial and temporal data in an operating environment, the distributed sensor nodes need to be connected together to form a distributed sensor system. The distributed sensor system consists of a collection of Sensor Nodes (SN) that is physically connected and is able to collect data about the environment in a distributed manner. An example embodiment of a distributed sensor system is shown in FIG. 5.

In this example embodiment of a distributed sensor system, the different components of the system are described. Different components of the distributed sensor system serve different functions as needed for the deployment in the environment.

Sensor Node Regions 400 serves to provide the sensing, control, communication and power.

Flexible Interconnect Regions 510 serves to connect different sensor nodes and other elements of the distributed sensor system Flexible Joint Region 520 serves to enable the distributed sensor system to make large changes in direction Joint Region 530 serves to connect or disconnect different Interconnect regions Attachment Region 580 serves to connect the distributed sensor system to the underlying substrate The sensor node region 400 provides the intelligence for the system since it contains the multiple sensors used to interface with the ambient environment, the interface circuit, the node controller, the communication capability and the power source.

In some cases, it is also possible to use the controller, communication and power source to drive several sensor nodes. In these implementations, the controller, communication and power source are provided at regular intervals in the system, the frequency determined by the specifications of the application.

To enable the distributed sensor system to be deployed in the field, it must be able to account for the topographical variations and be able to follow the contours of the surface to which it is attached. This means that the interconnects between the Sensor Nodes must be flexible with multiple degrees of freedom to enable the following of the surface contour and the ability to make sudden and large changes in direction. This flexible interconnect region 510 is a key feature of the distributed sensor system. The interconnect regions of the distributed sensor system are flexible and the degree of changes in direction that they can make depends on the fabrication process and also on the functionality of the system. If each sensor node is independent and does not rely on electrical wired connection on the neighboring nodes, the interconnect regions may be partially formed with non-conducting regions. On the other hand, if the sensor nodes share different components such that they are electrically wired together, the interconnect regions 510 must necessarily contain electrically conductive regions although they may also contain non-conducting material for passivation and protection.

If the interconnect regions 510 contain conductive metallic regions or silicon conductive regions, the degree of flexibility will be limited by the mechanical properties of the conductive regions. On the other hand, if the interconnect regions also contain non-conductive material, the flexibility of the interconnect region will be dependent on the mechanical properties of the interconnect material and also the geometrical dimensions (length, width and thickness). For example, if the interconnect region contains a region of a polymer such as polyimide, the mechanical properties of the polyimide allows large changes of direction and multiple degrees of freedom. Another material that can be used in the interconnect region is patterned parylene, which is not brittle and therefore allows large changes in angle of the interconnect region.

To enable the connected Sensor Nodes to make very large changes in direction (extreme angles), it is provided with periodic connection structures forming Flexible Joint Regions 520. The periodic connection structures that can be easily implemented are joints. These joints can be fabricated so as to allow multiple degrees of freedom depending on the design. One design of the joint may allow single degree of freedom, another may allow two degrees of freedom, and a further one may allow multiple degrees of freedom. As the design of the joint becomes more complex, it is capable of multi-axis degrees of freedom. Various flexible joint designs may be implemented so as to connect the flexible interconnect regions.

It is also possible that the flexible joint region 520 may be formed by a highly compliant region with low modulus of elasticity. Materials such as polymer and parylene can be patterned to form connections with low thickness and narrow traces that allow the joint to be highly flexible and allowing the distributed sensor system to follow the contours of the underlying substrate.

In order to use the distributed sensor system to a particular application, it is necessary to adjust the length of the distributed sensor system. This is enabled by the formation of a joint region 530 that is used for shortening or lengthening the distributed sensor system for a particular application. This joint region is characterized by a length of solder metal that is formed in the flexible interconnect region. This solder metal can be formed of Au/Sn, Pb/Sn, Sn/Ag/Cu, Sn/Ag etc. This structural feature in the distributed sensor system enables the scaling of the length of the distributed sensor system according to the application. In order to adjust the length of the distributed sensor system to a particular application, the joint region can be used to disconnect the distributed sensor system.

In the application environment, it will be necessary to attach the distributed sensor system to the underlying substrate so that it will maintain its spatial position. This means that the distributed sensor system must have locations in its structure that enables it to be attached to the substrate while still maintaining its topographical shape. The more uneven the underlying substrate, the more it is necessary to provide attachment points. These attachment points forms the adhesion regions for the distributed sensor system. In some cases, the sensor node region can be conveniently used also for attachment regions.

Thus, in the example embodiment of FIG. 5, the region between two flexible joint regions is used as an attachment region 580 in addition to the sensor node regions that are used for attachment to the substrate.

The attachment to the substrate can be achieved by a number of different methods. In one attachment method, the attachment region is coated with an adhesion layer, and then used to attach to the substrate. This adhesion layer may also be composed of multiple layers that are protected with an intermediate protective layer which is peeled by using a tab before attaching to the substrate. This multilayer adhesion method enables the removal of the distributed sensor system after a first application to a substrate, performing a function on the distributed sensor system such as recharging the power source, transferring the data etc. removing the protective layer over the second adhesion layer, and attaching to the same or another substrate.

The distributed sensor system may also contain a probe structure that is used for insertion into the substrate. For example, the probe structure may be used for insertion into a tissue for the purpose of monitoring a biological function. Thus, the probe may be used for measuring signals from a nerve cell or a muscle tissue. In this case, the probe may be used to measure action potentials and thus transduce the electrical impedance. The probe structure may also be used to measure the core body temperature which is different from the surface temperature. The probe structure may also contain an orifice or channel which allows a fluid to be collected and connected to a chemical or biological sensor or transferred into the point of insertion. In this case, the distributed sensor system is attached to the underlying substrate by the probe structure as well as the adhesion layer that is applied to the backside of the attachment region.

In other adhesion methods to attach the distributed sensor system to the underlying substrate, it is possible to use a magnetic layer in the attachment region.

The attachment region may also use other methods to connect the distributed sensor system with the underlying substrate depending upon the application. Thus, a method to attach the distributed sensor system to the substrate may use suction cups which causes a local area of vacuum thus attaching the distributed sensor system to the substrate. This method has the advantage of allowing of multiple attachments and detachments of the distributed sensor system.

The attachment region may also have small holes which allows micro-rivets or pins to be used for securing the distributed sensor system to the substrate. Other methods of attachment of the distributed sensor system may include UV activated bonding agents that secure distributed sensor system to the substrate. Also, spay-on adhesives may also be used in the attachment region.

When the underlying surface is very rough, it is possible to form a micro-velcro structure which can form a burr, thus allowing the distributed sensor system to be secured to the underlying rough surface.

Figure 6:
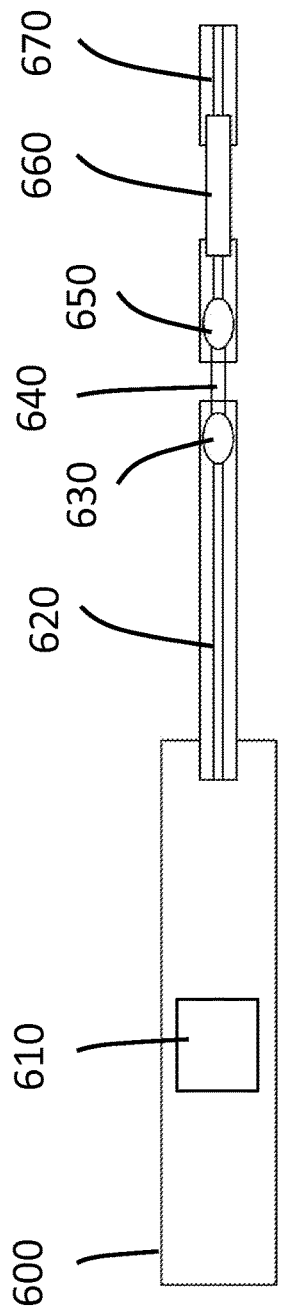
FIG. 6 shows a top view of a distributed sensor system with sensor node with MIMS device (Monolithically Integrated Multi-Sensor) in accordance with an example embodiment.
Figure 7:
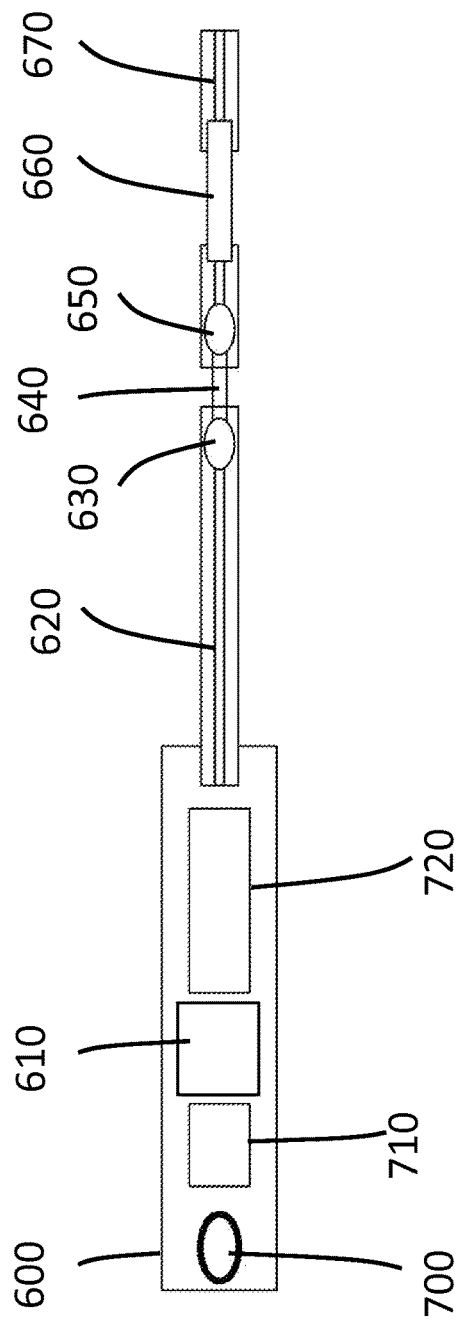
FIG. 7 shows a top view of a distributed sensor system with sensor node with MIMS device (Monolithically Integrated Multi-Sensor) in accordance with an example embodiment.

In FIG. 6, is an illustration of a top view of a sensor node containing a MIMS device in accordance with an example embodiment. In FIG. 6, 600 is the portion of the substrate where the MIMS device 610 is formed. The MIMS device 610 contains Direct Interface Sensors and Indirect Interface Sensors. The flexible interconnect regions are 620 and 670, while the flexible joint region is composed of 630, 640 and 650, which enables the distributed sensor system to make large changes in direction. The joint region is represented by 660. In FIG. 7, the sensor node is completed by the formation of the Integrated Circuit 720 and the addition of the power source 710 in accordance with an example embodiment. The antenna of the sensor node is represented by 700.

Figure 8:
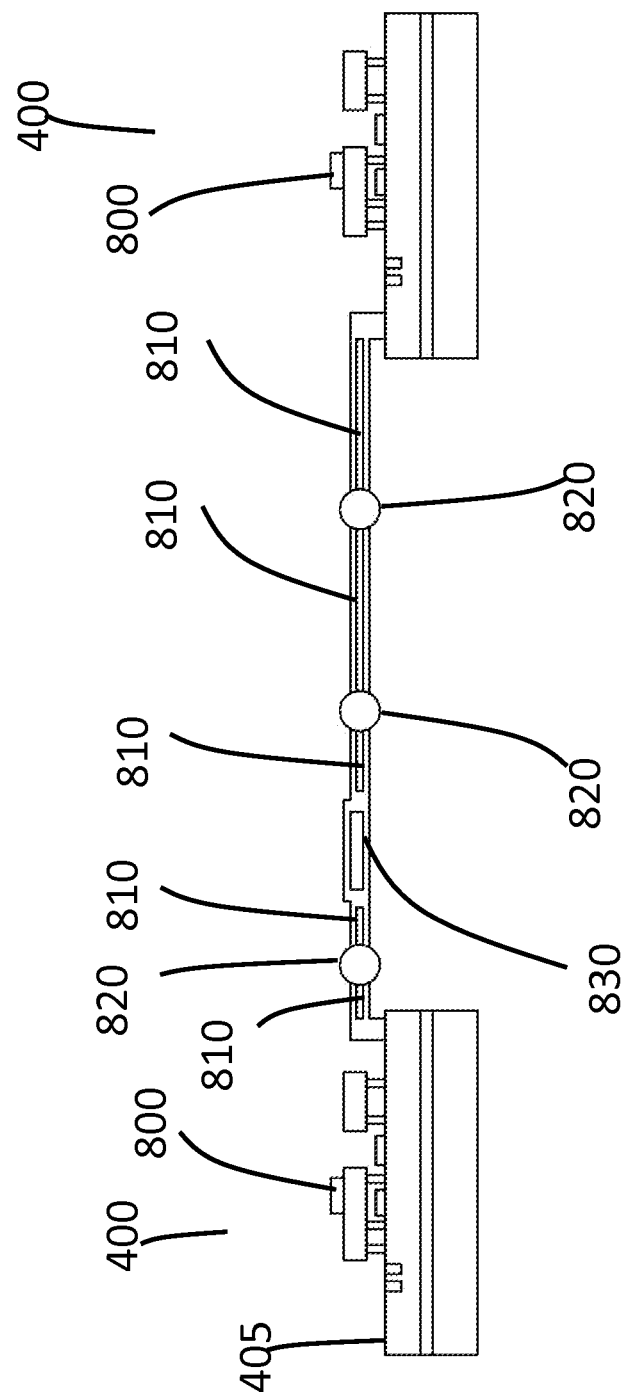
FIG. 8 illustrates a simplified cross section view of a distributed sensor system with sensor node with MIMS device (Monolithically Integrated Multi-Sensor) in accordance with an example embodiment.

Another example embodiment of a distributed sensor system is illustrated in FIG. 8. The sensor node 400 contains an additional capability to determine its position using element 800 connected to the integrated circuit. This position determining element 800 may be an integrated circuit using GPS (Global Positioning System) for accurate location of the sensor node 400. Element 800 may also use RTLS (real time location system) for accurate determination of the position of the sensor node 400. The elements 810 form the flexible interconnect regions while elements 820 form the flexible joint region. The element 830 form the joint region of the distributed sensor system illustrated in FIG. 8.

An example embodiment of a distributed sensor system is described with reference to FIG. 9. In this example embodiment, the MIMS device consisting of Direct Interface Sensors 930 and Indirect Interface Sensors 920 are formed on a substrate 850 consisting of a SOI (silicon on insulator) wafer with device layer 900, BOX layer 902 and handle layer 904. In addition, the antenna 910 is formed on the sensor node area of the substrate, either by direct fabrication or by direct attachment.

The substrate also contains on the top surface of device layer 900, the connection elements—flexible interconnection regions 940, flexible joint regions 950, joint region 960 and the attachment regions (patterned at a later step, described later). The flexible interconnection regions 940, flexible joint regions 950 and joint region 960 are suspended from the substrate by gap 980 and attached to the sensor node regions by connection regions 970.

FIG. 10 illustrates the distributed sensor system as a later stage of fabrication in accordance with an example embodiment. Trenches 990 are defined in the device layer 900 to separate the sensor node areas for the distributed sensor system. The trenches are patterned using resist and photolithography followed by an etch process that may include dry etch, wet etch or a combination of etches. In one embodiment, the trenches 990 are etched using DRIE (Deep Reactive Ion Etching so that the regions between the sensor nodes are removed.

In this example embodiment, the Integrated Circuit is separately fabricated and contains the interface circuit, the micro-controller, power management, communication circuitry. In addition, it contains the non-volatile memory for identification and calibration. The Integrated Circuit die is formed with TSVs (through silicon vias) and thinned.

Figure 11:
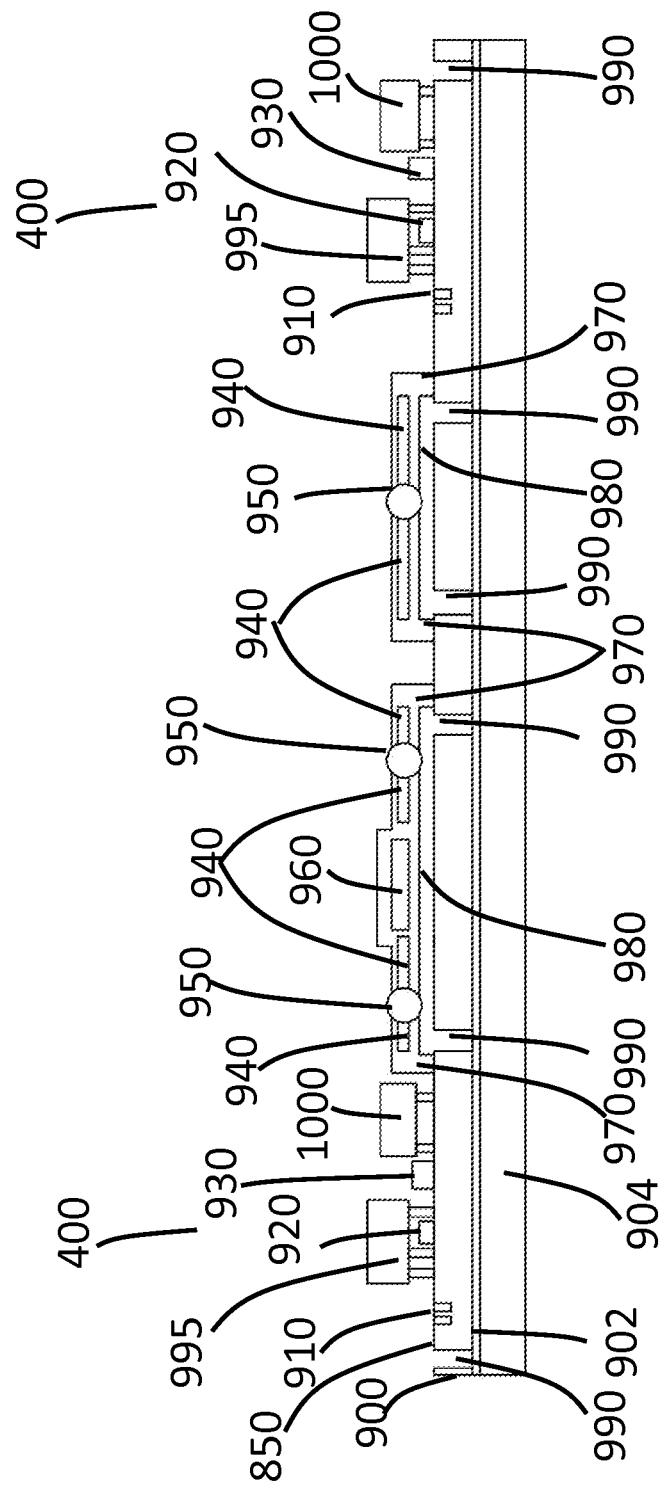
FIG. 11 illustrates a simplified cross view of a fabrication step of a distributed sensor system with sensor node with MIMS device (Monolithically Integrated Multi-Sensor) in accordance with an example embodiment.

FIG. 11 shows the substrate 850 with the integrated circuit 995 and power source 1000 attached to the sensor node 400 in accordance with an example embodiment. The integrated circuit 995 is attached to the sensor node using a vertical interconnect method. In one embodiment, the integrated circuit 995 contains TSVs (through silicon vias) and is connected to the sensor node using a metal solder process. The power source 1000 is also attached to the sensor node as illustrated in FIG. 11. In one embodiment, the power source 1000 is a thin-film battery.

Figure 12:
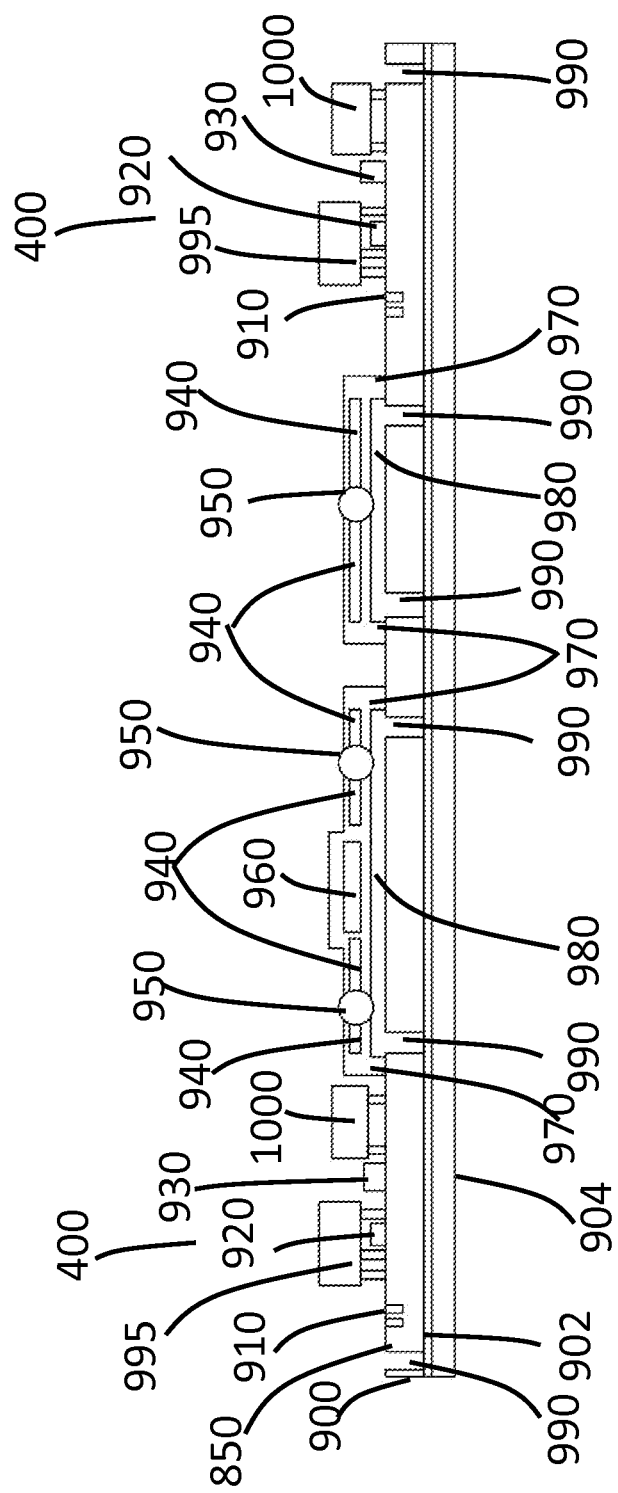
FIG. 12 illustrates a simplified cross view of a fabrication step of a distributed sensor system with sensor node with MIMS device (Monolithically Integrated Multi-Sensor) in accordance with an example embodiment.

As illustrated in FIG. 12, the substrate with the sensor node, integrated circuit and power source is thinned till the alignment keys (not shown) in the substrate are exposed on the backside in accordance with an example embodiment. The thinning of the substrate may be done by mechanical processes, wet chemical etching, dry etching, or a combination of mechanical and chemical processes. No matter what process is used, the substrate is thinned as illustrated in FIG. 12.

Figure 13:
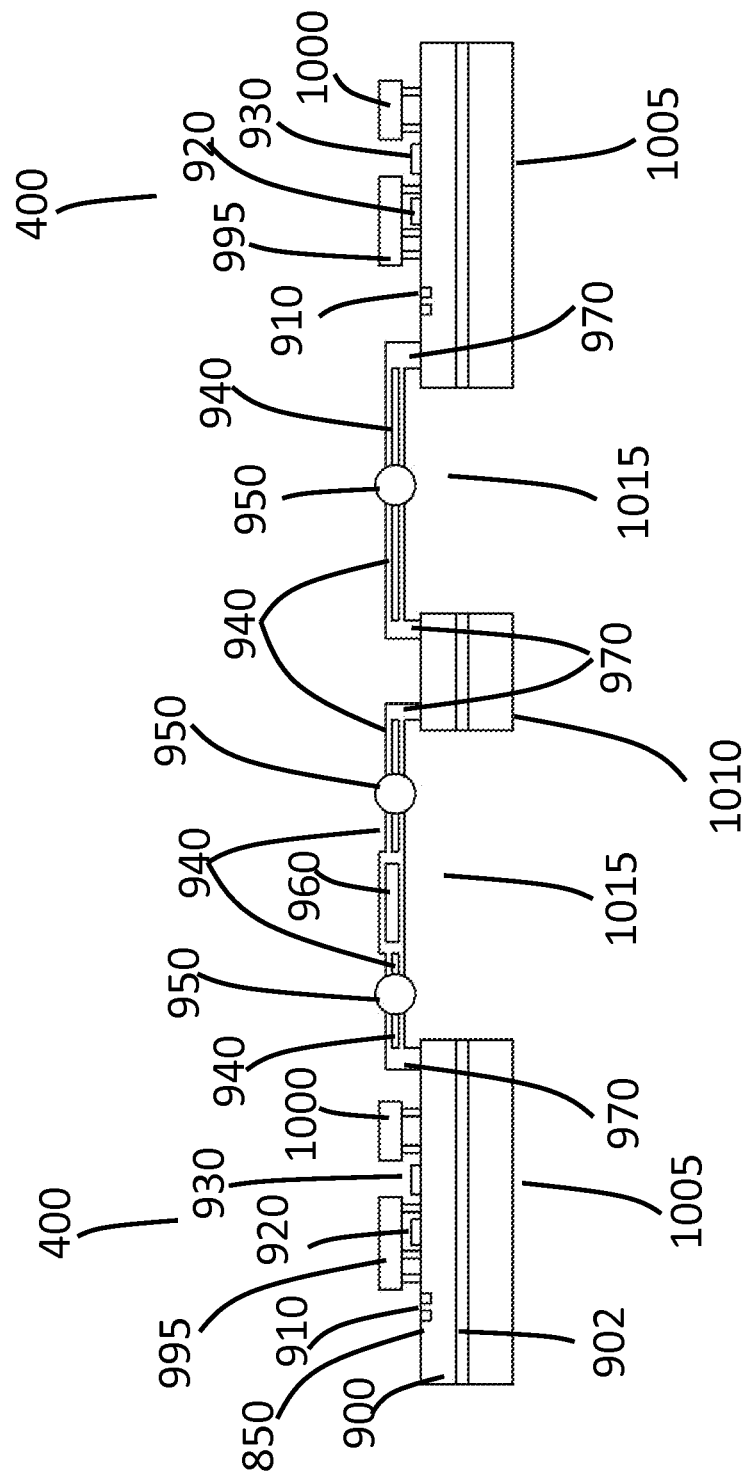
FIG. 13 illustrates a simplified cross view of a fabrication step of a distributed sensor system with sensor node with MIMS device (Monolithically Integrated Multi-Sensor) in accordance with an example embodiment.

FIG. 13 illustrates the completion of the formation of the distributed sensor system in accordance with the example embodiment. The backside of the substrate is patterned using resist and photolithography using the alignment keys described earlier and then etched to remove selected portions of the handle layer 904, BOX layer 902 and device layer 900. The etching process may be a dry etch, wet etch or a combination of dry and wet etch. This etching of the backside of the substrate defines the sensor nodes 1005 for the distributed sensor system. Thus, portions of the substrate is removed to expose the interconnect regions in regions 1015. The attachment region 1010 is also defined in this process.

It is also possible in some implementations that the substrate for the distributed sensor system is the integrated circuit and the sensor node is formed on it with the addition of the multiple sensors, the power source and antenna. The integrated circuit then has all the interconnect regions formed on it using fabrication techniques that are compatible with CMOS processing.

Figure 14:
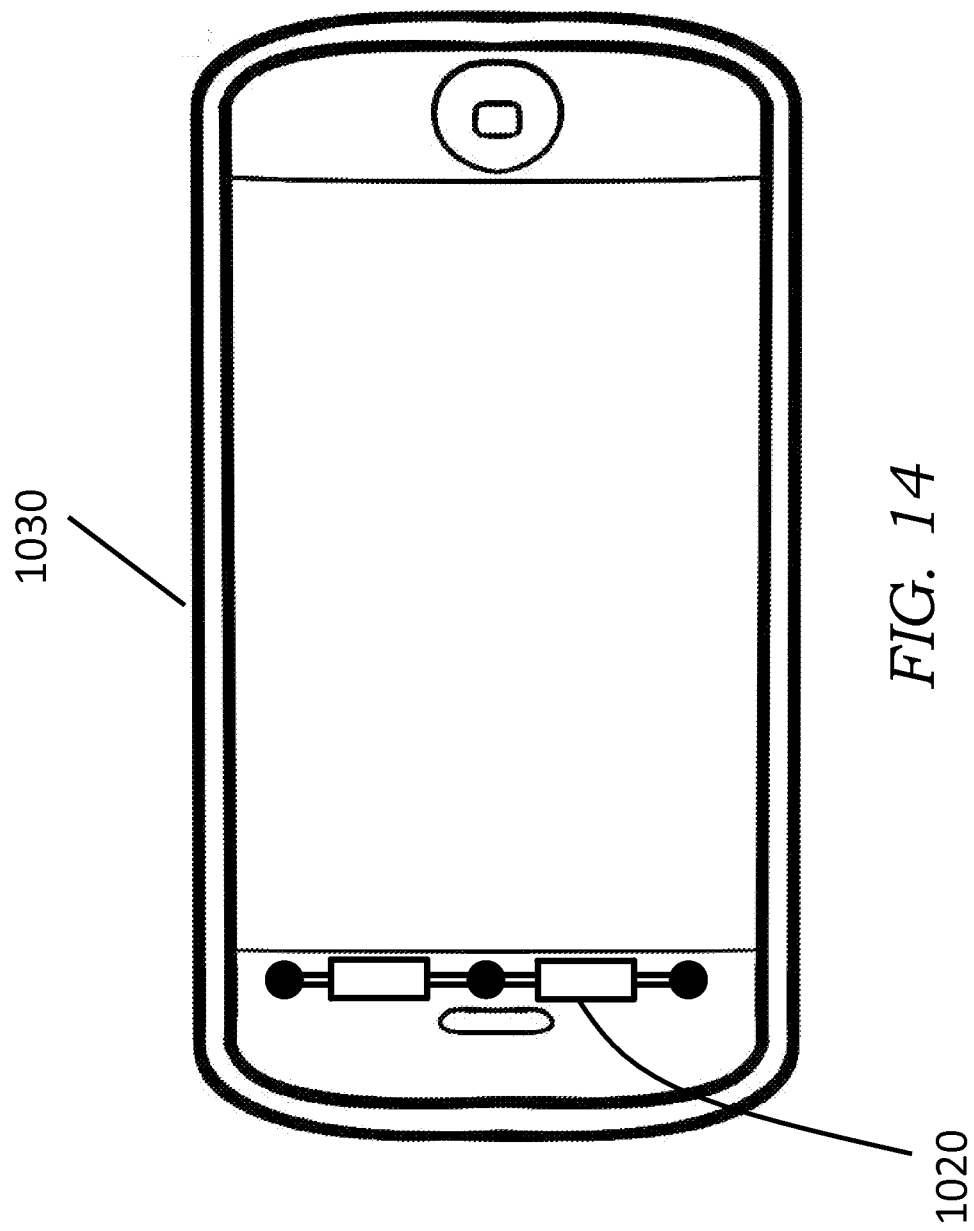
FIG. 14 illustrates a distributed sensor system with sensor node with MIMS device (Monolithically Integrated Multi-Sensor) in a cellphone in accordance with an example embodiment.

FIG. 14 illustrates a distributed sensor system 1020 used in a cellphone 1030 in accordance with an example embodiment. The distributed sensor system 1020 contains MIMS devices with Direct Interface Sensors and Indirect Interface Sensors. In one embodiment, the distributed sensor system may contain MIMS devices with sound sensitive microphones that are distributed and are capable of receiving sound waves in different locations of the distributed sensor system so as to extract additional information about the sound waves.

Figure 15:
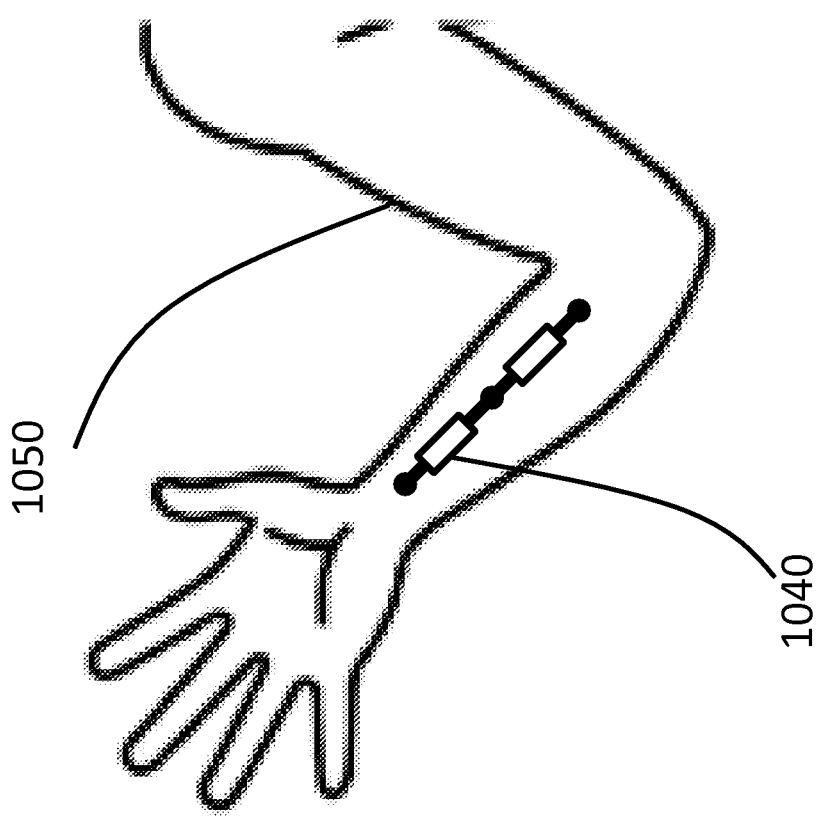
FIG. 15 illustrates a distributed sensor system with sensor node with MIMS device (Monolithically Integrated Multi-Sensor) in a wearable device in accordance with an example embodiment.

FIG. 15 illustrates a distributed sensor system 1040 used as a wearable device attached to an arm 1050 in accordance with an example embodiment. The distributed sensor system 1040 contains MIMS devices with Direct Interface Sensors and Indirect Interface Sensors. In one embodiment, the distributed sensor system may contain MIMS devices with probes that are distributed and connected to the skin and are capable of measuring electric bio-potentials in different locations of the distributed sensor system attached on the arm so as to extract additional information about the electric bio-potentials.

Figure 16:
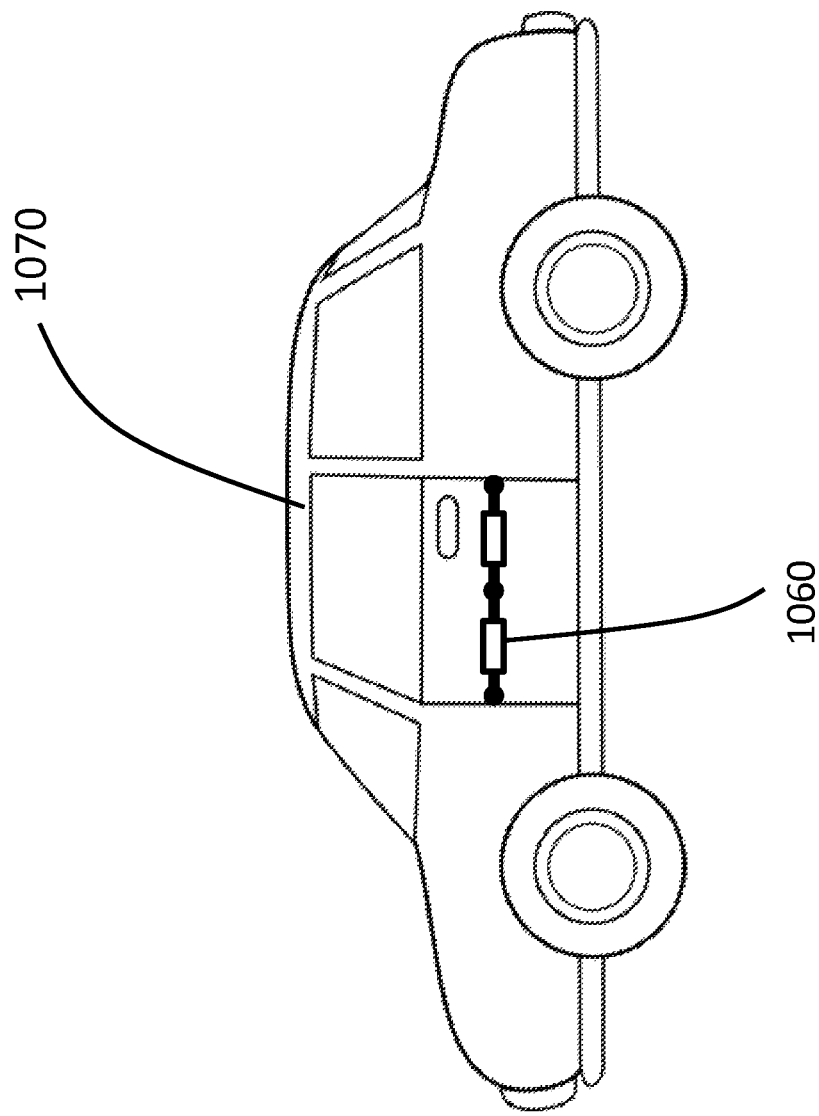
FIG. 16 illustrates distributed sensor system node with MIMS device (Monolithically Integrated Multi-Sensor) in a transportation device in accordance with an example embodiment.

FIG. 16 illustrates a distributed sensor system 1060 used in a transportation device 1070 such as a car in accordance with an example embodiment. The distributed sensor system 1060 contains MIMS devices with Direct Interface Sensors and Indirect Interface Sensors. In one embodiment, the distributed sensor system may contain MIMS devices with accelerometers and pressure sensors that are distributed and are capable of receiving inertial force and pressure in different locations of the distributed sensor system so as to extract additional information. In one embodiment, the distributed acceleration sensors and pressure sensors may gather inputs about the direction and magnitude of a crash event involving the car 1070.

A distributed sensor system is disclosed herein that provides spatial and temporal data in an operating environment. The distributed sensor nodes can be coupled together to form a distributed sensor system. For example, a distributed sensor system comprises a collection of Sensor Nodes (SN) that is physically coupled and is able to collect data about the environment in a distributed manner. An example of a distributed sensor system comprises a first sensor node and a second sensor node. Each sensor node has a plurality of sensors or a MIMS device. Each sensor node can also include electronic circuitry or a power source. A joint region is coupled between a first flexible interconnect region and a second flexible interconnect region. The first sensor node is coupled to the first flexible interconnect region. Similarly, the second sensor node is coupled to the second flexible interconnect region.

Sensor Nodes comprise a plurality of sensors. The plurality of sensors can be a MIMS device or stacked devices. The plurality of sensors can comprise sensors of different types such as indirect or direct sensors. Electronic circuitry can also be placed on a Sensor Node. Interface circuitry, microprocessor, digital signal processor, control logic, communication circuitry, and memory are some of the types of circuits coupled to circuits to form a system. Other devices such as an antenna and a power source can also be on a Sensor Node.

The flexible interconnect regions couple sensor nodes electrically and physically. The flexible interconnect regions further provide multiple degrees of freedom that support following surface contours or sudden changes of direction. For example, flexible interconnect regions can comprise a polymer such as parylene. This supports integration into cell phones, communication devices, automobiles, transportation devices or wearable devices where form factor and placing different sensors in predetermined locations is paramount to the application.

A joint region can be placed between two flexible interconnect regions. The joint region couples flexible interconnect regions together and supports a change in direction between the flexible interconnect regions. The flexible interconnect regions and the joint region have corresponding retaining features that support coupling and change in direction. In general, the joint region includes a plurality of retaining features that support coupling to other devices. The joint region can further include electrical interconnect to support coupling Sensor Nodes together.

While the present invention has been described with reference to particular embodiments, those skilled in the art will recognize that many changes may be made thereto without departing from the spirit and scope of the present invention. Each of these embodiments and obvious variations thereof is contemplated as falling within the spirit and scope of the invention.

What is claimed is:

1. A distributed sensor system comprising:
a first sensor node comprising a plurality of sensors formed on or coupled to a substrate;
a first flexible interconnect region coupled to the first sensor node;
a first joint region coupled to the first flexible interconnect region;
a second flexible interconnect region coupled to the first joint region; and
a second sensor node coupled to the second flexible interconnect wherein the first joint region is configured to be decoupled from the first flexible interconnect region or the second flexible interconnect region wherein the first joint region is replaced with a second joint region that is shorter or longer than the first joint region when recoupled to the first flexible interconnect region or the second flexible interconnect region such that the length between the first sensor node and the second sensor node is decreased or increased.

2. The distributed sensor system of claim 1 wherein the first joint region has a first length and wherein in the second joint region is the first joint region shortened to a second length that is shorter than the first length.

3. The distributed sensor system of claim 1 wherein the at least one joint region, the first flexible interconnect, or the second flexible interconnect comprises a metal or a metal alloy that enables the scaling of the length of the distributed sensor system.

4. The distributed sensor system of claim 3 wherein the metal or metal alloy of the first joint region comprises at least one of Au/Sn, Sn/Ag/Cu, Sn/Ag, or a solder.

5. The distributed sensor system of claim 1 wherein the first or second flexible interconnect regions comprises parylene that supports multi-axis degrees of freedom, and wherein the first or second flexible interconnect regions includes conductive traces.

6. The distributed sensor system of claim 1 further including an attachment region wherein the attachment region is coated with an adhesion layer.

7. The distributed sensor system of claim 6 further including a plurality of adhesion layers separated by protective layers and wherein a spent or decoupled adhesion layer can be removed by removing an underlying protective layer thereby exposing a new adhesion layer.

8. The distributed sensor system of claim 6 wherein the adhesion layer is activated by ultraviolet light.

9. The distributed sensor system of claim 1 wherein the first joint region is configured to couple by a local vacuum and wherein the first joint region is configured to be decoupled by overcoming the local vacuum.

10. The distributed sensor system of claim 1 wherein the first joint region is configured to couple by micro-rivets or pins or wherein the first joint region is configured to couple by a micro-velcro structure or wherein the first joint region can be decoupled by overcoming the micro-velcro structure.

11. The distributed sensor system of claim 1 wherein the first joint region is configured to be coupled by magnetic force and wherein the first joint region is configured to be decoupled by overcoming the magnetic force.

12. A distributed sensor system comprising a plurality of sensor nodes coupled together by a plurality of flexible interconnect regions, wherein the plurality of flexible interconnect regions are configured to provide multiple degrees of freedom that support following surface contours or sudden changes of direction, where the flexible interconnect comprises a polymer, wherein the distributed sensor system further includes a joint region coupled between at least two sensor nodes of the plurality of sensor nodes, wherein the joint region is configured to be decoupled and recoupled to support shortening or lengthening a distance between the two sensor nodes of the plurality of sensor nodes, wherein the joint region is configured to be replaced with a longer joint region, and wherein the longer joint region is configured to be recoupled between the two sensor nodes of the plurality of sensor nodes.

13. The distributed sensor system of claim 12 wherein the joint region is configured to be shortened and wherein the shortened joint region is configured to be recoupled to shorten the distance between the two sensor nodes of the plurality sensor nodes.

14. The distributed sensor system of claim 13 wherein one or more joint regions are configured to be coupled between the at least two sensor nodes to increase or decrease a distance between the at least two sensor nodes.

15. The distributed sensor system of claim 12 wherein the joint region couples to at least one of the plurality of flexible interconnect region and includes conductive traces that enables the scaling of the length of the distributed sensor.

16. The distributed sensor system of claim 15 further including an attachment region wherein the attachment region is coated with an adhesion layer that retains the at least one joint region to the attachment region.

17. The distributed sensor system of claim 16 wherein the joint region or the attachment region includes a plurality of adhesion layers separated by protective layers and wherein a spent or decoupled adhesion layer can be removed by removing an underlying protective layer thereby exposing a new adhesion layer.

18. The distributed sensor system of claim 16 wherein the adhesion layer is activated by ultraviolet light.

19. The distributed sensor system of claim 12 wherein at least one of the plurality of flexible interconnect regions is configured to be coupled by magnetic force and wherein the at least one of the plurality of flexible interconnect is configured to be decoupled by overcoming the magnetic force.

20. A distributed sensor system comprising:
a plurality of sensor nodes;
an interconnect regions coupled to at least one of the plurality of sensor nodes; and
a joint region coupled between two sensor nodes of the plurality of sensor nodes wherein the joint region is configured to be coupled, decoupled, and recoupled to lengthen or shorten a distance between the two sensor nodes of the plurality of sensor nodes in the distributed sensor system wherein the joint is configured to be shortened and recoupled to shorten the distance between the two sensor nodes.

* * * * *